United States Patent
Cho et al.

(10) Patent No.: US 8,664,687 B2
(45) Date of Patent: Mar. 4, 2014

(54) NITRIDE SEMICONDUCTOR LIGHT-EMITTING DEVICE AND PROCESS FOR PRODUCING THE SAME

(75) Inventors: Dong Hyun Cho, Daegu (KR); Masayoshi Koike, Kyungki-do (KR); Yuiji Imai, Kyungki-do (KR); Min Ho Kim, Kyungki-do (KR); Bang Won Oh, Kyungki-do (KR); Hun Joo Hahm, Kyungki-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 1346 days.

(21) Appl. No.: 10/898,204

(22) Filed: Jul. 26, 2004

(65) Prior Publication Data

US 2005/0218416 A1    Oct. 6, 2005

(30) Foreign Application Priority Data

Mar. 31, 2004 (KR) ................. 10-2004-0021906

(51) Int. Cl.
*H01L 33/00* (2010.01)

(52) U.S. Cl.
USPC ............ 257/103; 257/95; 257/98; 257/117; 257/594; 257/E21.121; 257/E33.074

(58) Field of Classification Search
USPC .............................. 257/117, 594, 98, 103, 95
See application file for complete search history.

(56) References Cited

U.S. PATENT DOCUMENTS

| | | | | |
|---|---|---|---|---|
| 6,091,083 | A * | 7/2000 | Hata et al. | 257/79 |
| 6,841,808 | B2 * | 1/2005 | Shibata et al. | 257/190 |
| 2002/0115267 | A1 * | 8/2002 | Tomiya et al. | 438/478 |
| 2002/0127856 | A1 * | 9/2002 | Kunisato et al. | 438/689 |
| 2003/0209705 | A1 * | 11/2003 | Emerson et al. | 257/14 |
| 2004/0048471 | A1 * | 3/2004 | Okagawa et al. | 438/689 |
| 2005/0161697 | A1 * | 7/2005 | Nakahata et al. | 257/103 |
| 2005/0263778 | A1 * | 12/2005 | Hata et al. | 257/79 |
| 2006/0237739 | A1 * | 10/2006 | Shono et al. | 257/98 |

FOREIGN PATENT DOCUMENTS

| | | | |
|---|---|---|---|
| JP | 5-36602 | * | 2/1993 |
| JP | 8-148718 A | | 6/1996 |
| JP | 09-027636 A | | 1/1997 |
| JP | 09-036427 A | | 2/1997 |
| JP | 9-27636 | * | 9/1997 |
| JP | 10-335701 | * | 12/1998 |
| JP | 2001-257427 A | | 9/2001 |
| JP | 2001-257429 A | | 9/2001 |
| JP | 2001-267692 | * | 9/2001 |
| JP | 2002-305162 A | | 10/2002 |
| JP | 2003-158344 A | | 5/2003 |
| JP | 2003-198045 A | | 7/2003 |
| KR | 2005-23540 | * | 3/2005 |

OTHER PUBLICATIONS

Japanese Patent Office, Office Action mailed, Jun. 12, 2007 and English Translation.

* cited by examiner

*Primary Examiner* — A. Sefer
(74) *Attorney, Agent, or Firm* — Lowe Hauptman & Ham, LLP

(57) ABSTRACT

Provided are a nitride semiconductor light-emitting device comprising a polycrystalline or amorphous substrate made of AlN; a plurality of dielectric patterns formed on the AlN substrate and having a stripe or lattice structure; a lateral epitaxially overgrown-nitride semiconductor layer formed on the AlN substrate having the dielectric patterns by Lateral Epitaxial Overgrowth; a first conductive nitride semiconductor layer formed on the nitride semiconductor layer; an active layer formed on the first conductive nitride semiconductor layer; and a second conductive nitride semiconductor layer formed on the active layer; and a process for producing the same.

1 Claim, 2 Drawing Sheets

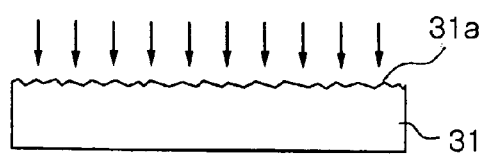
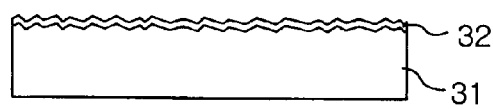
FIG. 3a  FIG. 3b
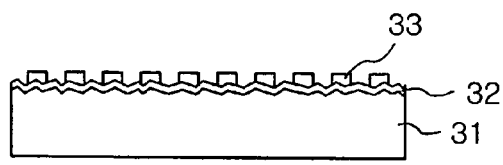
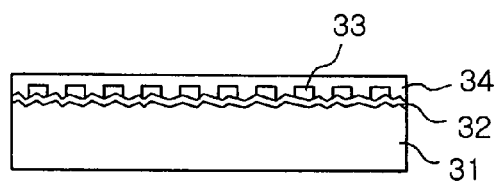
FIG. 3c  FIG. 3d
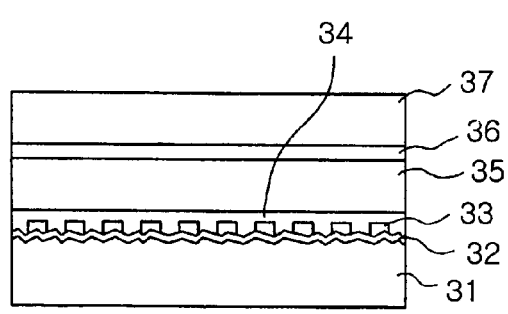
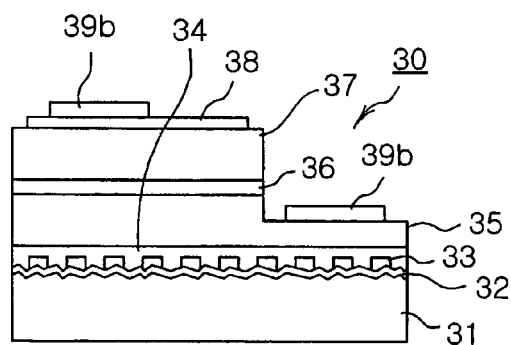
FIG. 3e  FIG. 3f

NITRIDE SEMICONDUCTOR LIGHT-EMITTING DEVICE AND PROCESS FOR PRODUCING THE SAME

RELATED APPLICATIONS

The present application is based on, and claims priority from, Republic of Korea Application Serial Number 2004-21906, filed Mar. 31, 2004, the disclosure of which is hereby incorporated by reference herein in its entirety.

BACKGROUND OF THE INVENTION

1. Field of the Invention

The present invention relates to a nitride semiconductor light-emitting device, and more particularly to a nitride semiconductor light-emitting device having an AlN polycrystalline or amorphous substrate and a process for producing the same.

2. Description of the Related Art

Generally, a great deal of attention has been directed to nitride semiconductor crystals as a material for use in preparing visible and ultraviolet light LEDs and blue-green color optical devices such as light-emitting diodes or laser diodes, because they produce light with a broad spectrum including the entire visible light region and also the ultraviolet light region.

In order to prepare a high efficiency optical device with such nitride semiconductor crystals, there is essentially required a technique which enables a nitride semiconductor to grow into a high quality single crystal thin film. However, the III-A group nitride semiconductors are not suitable for general substrates due to their lattice constant and thermal expansion coefficient and thus have a difficulty in growing a single crystal thin film.

To grow nitride semiconductor crystals, a sapphire ($Al_2O_3$) or SiC substrate is limitedly employed only. For example, nitride semiconductor crystals may be grown on the sapphire substrate by heteroepitaxy methods using Metal Organic Chemical Vapor Deposition (MOCVD), Molecular Beam Epitaxy (MBE), and the like.

But, despite use of such a nitride semiconductor single crystal substrate, it is difficult to directly grow a high quality nitride semiconductor single crystal on the substrate due to inconsistency of a lattice constant and a thermal expansion coefficient therebetween, and thus a low temperature nucleus-growth layer and a buffer layer are additionally used. FIG. 1 is a cross-sectional side view of a conventional nitride semiconductor light-emitting device.

As shown in FIG. 1, a conventional nitride semiconductor light-emitting device, which is designated by reference number 10, includes an n-type nitride semiconductor layer 15 formed on a sapphire substrate 11, an active layer 16 having a multi-well structure 16 and a p-type nitride semiconductor layer 17. An n-electrode 19a was formed on a region of the exposed portion of the n-type nitride semiconductor layer 15 by removing and exposing some portions of the p-type nitride semiconductor layer 17 and the active layer 10. A transparent electrode 18 containing Ni and Au, and a p-electrode 19b were formed on the p-type GaN semiconductor layer 17.

Further, a buffer layer was formed on the sapphire substrate in order to grow high quality nitride semiconductor crystals. As the buffer layer, a low temperature nucleus-growth layer such as $Al_xGa_{1-x}N$ wherein x is between 0 and 1, is usually used.

However, even when a nitride semiconductor single crystal was grown on the sapphire substrate after forming the low temperature nucleus-growth layer, the nitride semiconductor single crystal had crystal defects of about $10^9$ to about $10^{10}$ $cm^{-2}$. In particular, these crystal defects propagate in the vertical direction and thus exhibit adverse effects responsible for leakage of electrical current.

On the other hand, the conventional sapphire or SiC substrate may have disadvantages of high cost, lower thermal conductivity, and lower mechanical properties, resulting in increased production costs and deterioration of device characteristics, as compared to an AlN polycrystalline or amorphous substrate. But, the AlN polycrystalline or amorphous substrate is not suitable for growth of the nitride single crystal layer and thus is not usually used as a substrate for the nitride semiconductor light-emitting device.

SUMMARY OF THE INVENTION

Therefore, the present invention has been made in view of the above problems, and it is an object of the present invention to provide a nitride semiconductor light-emitting device comprising a high quality nitride semiconductor layer grown on an AlN polycrystalline or amorphous substrate by Lateral Epitaxial Overgrowth (LEO).

It is another object of the present invention to provide a process for producing a nitride semiconductor light-emitting device comprising the step of forming a high quality nitride semiconductor layer on an AlN polycrystalline or amorphous substrate by using LEO.

In accordance with the present invention, the above and other objects can be accomplished by the provision of a nitride semiconductor light-emitting device comprising:

a polycrystalline or amorphous substrate made of AlN;

a plurality of dielectric patterns formed on the AlN substrate and having a stripe or lattice structure;

a lateral epitaxially overgrown-nitride semiconductor layer formed on the AlN substrate having the dielectric patterns by Lateral Epitaxial Overgrowth (LEO);

a first conductive nitride semiconductor layer formed on the nitride semiconductor layer;

an active layer formed on the first conductive nitride semiconductor layer; and a second conductive nitride semiconductor layer formed on the active layer.

Preferably, the AlN substrate has an upper surface having irregularities formed to face in a predetermined direction.

The nitride semiconductor light-emitting device may further include a buffer layer formed on the AlN substrate. Preferably, the buffer layer may be a low temperature nucleus-growth layer made of a material having the formula of $Al_xGa_{1-x}N$ wherein x is between 0 and 1.

Preferably, the buffer layer has an upper surface having irregularities formed in a predetermined face direction.

Dielectric patterns used in the present invention may be made of $SiO_2$ or SiN. The lateral epitaxially overgrown-nitride semiconductor layer may be formed of the nitride semiconductor layer containing first conductive impurities and then may be provided as a clad layer having the same conductivity-type as that of the first conductive nitride semiconductor layer.

The first conductive nitride semiconductor layer may be a p-type nitride semiconductor layer. The second conductive nitride semiconductor layer may be an n-type nitride semiconductor layer. In this case, an n-type nitride semiconductor layer with a relatively low electrical resistance is used as a capping layer and thus a transparent electrode layer for ohmic contact may be eliminated.

Further, the present invention provides a process for producing a novel nitride semiconductor light-emitting device.

The above-mentioned process comprises the steps of:
providing a polycrystalline or amorphous substrate made of AlN;
forming a plurality of dielectric patterns having a stripe or lattice structure on the AlN substrate;
forming a lateral epitaxially overgrown-nitride semiconductor layer on the AlN substrate having the dielectric patterns by Lateral Epitaxial Overgrowth (LEO);
forming a first conductive nitride semiconductor layer on the nitride semiconductor layer;
forming an active layer on the first conductive nitride semiconductor layer; and
forming a second conductive nitride semiconductor layer on the active layer.

Preferably, the process may further comprise the step of etching the upper surface of the AlN substrate such that irregularities are formed on the AlN substrate in a predetermined face direction. The etching step may include a step of applying wet etching to the AlN substrate using an etching solution containing NaOH.

The process may further comprise the step of forming a buffer layer on the AlN substrate, prior to forming the dielectric patterns. Preferably, the buffer layer may be a low temperature nucleus-growth layer made of a material having the formula of $Al_xGa_{1-x}N$ wherein x is between 0 and 1. In accordance with the present invention, the process may further comprise the step of etching the upper surface of the buffer layer such that irregularities are formed on the buffer layer in a predetermined face direction.

Further, the dielectric patterns may be made of $SiO_2$ or SiN. The lateral epitaxially overgrown-nitride semiconductor layer may be a nitride semiconductor layer containing first conductive impurities. The first conductive nitride semiconductor layer may be a p-type nitride semiconductor layer. The second conductive nitride semiconductor layer may be an n-type nitride semiconductor layer.

Where the lateral epitaxially overgrown-nitride semiconductor layer is a nitride semiconductor layer containing Al, the step of forming the lateral epitaxially overgrown-nitride semiconductor layer may comprise the step of forming the lateral epitaxially overgrown-nitride semiconductor layer by LEO while injecting Cl- or Br-based gas. As the Br- or Cl-based gas, a gas containing at least one selected from the group consisting of $Br_2$, $Cl_2$, $CBr_4$, $CCl_4$, HBr and HCl may be used.

The present invention provides a new type of nitride semiconductor device by forming a nitride semiconductor layer on AlN polycrystalline or amorphous substrate in place of a conventional sapphire or SiC substrate. That is, a high quality nitride semiconductor layer may be grown by Lateral Epitaxial Overgrowth using dielectric patterns having a stripe or lattice structure. More preferably, a higher quality nitride semiconductor layer may be grown by applying a given etching solution such as NaOH to the AlN polycrystalline or amorphous substrate to form irregularities facing a desired direction.

BRIEF DESCRIPTION OF THE DRAWINGS

The above and other objects, features and other advantages of the present invention will be more clearly understood from the following detailed description taken in conjunction with the accompanying drawings, in which:

FIGS. 3a-3f are a flow chart illustrating a process for producing a nitride semiconductor light-emitting device according to another embodiment of the present invention.

DESCRIPTION OF THE PREFERRED EMBODIMENTS

Figure 1:
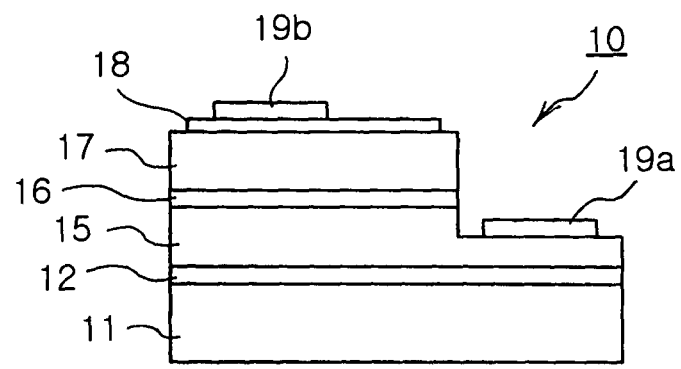
FIG. 1 is a cross-sectional side view of a conventional nitride semiconductor light-emitting device.
Figure 2:
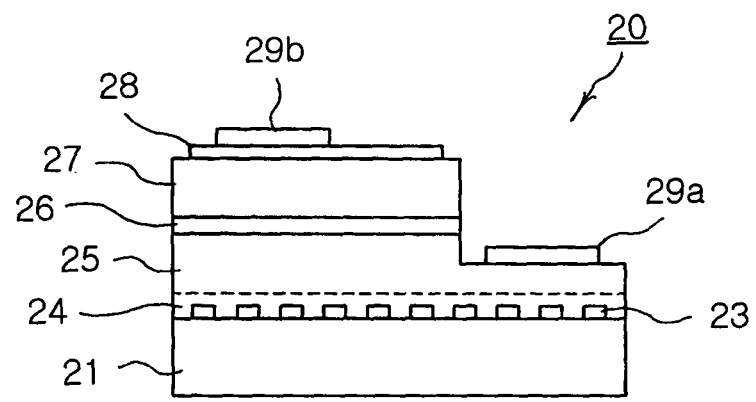
FIG. 2 is a cross-sectional side view of a nitride semiconductor light-emitting device according to one embodiment of the present invention.

Now, the present invention will be described in detail with reference to the attached drawings. FIG. 2 is a cross-sectional side view of a nitride semiconductor light-emitting device according to one embodiment of the present invention.

A nitride semiconductor light-emitting device 20 includes an AlN polycrystalline substrate 21. The AlN substrate 21 may comprise Ga and/or In, resulting in (GaIn)AlN. The AlN polycrystalline substrate 21 was provided with a plurality of dielectric patterns 23 having a stripe or lattice structure which were arranged side by side. The AlN polycrystalline substrate 21 having the dielectric patterns formed thereon was provided with a lateral epitaxially overgrown-nitride semiconductor layer 24 grown by Lateral Epitaxial Overgrowth (LEO). On the nitride semiconductor layer 24 were sequentially formed an n-type nitride semiconductor layer 25, an active layer 26 having a multiple-well structure and a p-type nitride semiconductor layer 27.

Further, a transparent electrode layer 28 such as Ni/Au was formed on the p-type nitride semiconductor layer 27 in order to decrease contact resistance. Each of p- and n-electrodes 29b and 29a was provided on the transparent electrode layer 28 and the n-type nitride semiconductor layer 25.

The lateral epitaxially overgrown-nitride semiconductor layer 24 formed on the AlN polycrystalline substrate 21 was formed by LEO using dielectric patterns 23 having a stripe or lattice structure. Therefore, since crystals grow onto the dielectric patterns 23 in the lateral direction, defects progressing in the vertical direction, i.e. the potentials occurring between the interface of heterologous materials may be greatly reduced, unlike a conventional growth method. Therefore, by decreasing potentials which propagate to an active layer, leakage of electric current due to the crystal defects may be significantly reduced. These dielectric patterns may be made of $SiO_2$ or SiN.

The lateral epitaxially overgrown-nitride semiconductor layer 24 used in the present invention may be formed of an undoped nitride semiconductor layer. Alternatively, the layer 24 may also be formed of a nitride semiconductor layer having the same conductivity-type as that of the nitride semiconductor layer 25 formed on the upper part thereof.

For example, in this embodiment, the n-type lateral epitaxially overgrown-nitride semiconductor layer 24 may be formed by injecting n-type impurities to cause lateral epitaxial overgrowth, and may constitute an n-clad layer in integrated form with the n-type nitride semiconductor layer 25 formed on the upper part thereof.

Further, unlike this embodiment, a structure having a p-type nitride semiconductor layer disposed between an AlN polycrystalline substrate and an active layer, and the n-type nitride semiconductor layer disposed on the upper part of the active layer may be also provided. In this case, the n-type nitride semiconductor layer has a relatively low electrical resistance compared to the p-type nitride semiconductor layer. Thus, a transparent electrode structure 28 formed on the upper part of the p-type nitride semiconductor layer 27 as shown in FIG. 2 may be eliminated.

FIGS. 3a-3f are a flow chart illustrating a process for producing a nitride semiconductor light-emitting device according to another embodiment of the present invention.

First, as shown in FIG. 3a, an AlN polycrystalline substrate 31 was prepared. That is, the present invention does not use a sapphire substrate but instead uses an AlN polycrystalline substrate 31 having a relatively high thermal conductivity and excellent mechanical properties.

As can be seen from FIG. 3a, it is preferable to additionally etch the upper surface of the AlN polycrystalline substrate 31 so as to form irregularities 31a having a desired crystal face. Generally, etching rate varies depending on a direction of the crystal face, and then each irregularity 31a may have a main face direction in a certain direction by applying wet etching using an etching solution such as NaOH, or the like. The main face direction of the irregularities 31a may provide more advantageous growth face conditions for forming a nitride single crystal layer in a subsequent process. For instance, suitably shaped irregularities may be obtained by applying a NaOH etching solution to the AlN polycrystalline substrate 31 at a temperature of about 60° C. for 10 minutes.

Then, as shown in FIG. 3b, a buffer layer 32 may be provided on the AlN polycrystalline substrate 31. In accordance with the present invention, the buffer layer 32 may be optionally provided to obtain superior nitride crystals. As the buffer layer 32, a material satisfying a composition formula of $Al_xGa_{1-x}N$ wherein x is between 0 and 1, may be provided. For instance, a low temperature nucleus-growth layer made of AlN, GaN, AlGaN, or the like may be used. In this step, an etching process may be additionally carried out so as to form irregularities having a desired crystal face on the buffer layer 32. As described in the etching process for the AlN polycrystalline substrate, this is designed to provide advantageous growth conditions for the nitride single crystal layer in a subsequent process by forming irregularities having a certain crystal face direction in the main face direction. The etching process for forming irregularities need not be carried out on the AlN polycrystalline substrate 31, but may instead be carried out only in this step or may be carried out in both of them.

Next, as shown in FIG. 3c, a plurality of dielectric patterns 33 having a stripe or lattice structure were formed on the buffer layer 32. The dielectric patterns 33 may be obtained by vapor-depositing dielectric materials such as $SiO_2$ and $Si_3N_4$ on the entire upper surface of the buffer layer 32, and then selectively removing the deposited portion thereof so as to form stripe patterns (or lattice patterns) by using a photolithography process. Alternatively, where the buffer layer 32 is not present, the dielectric patterns 33 may be provided directly on the upper surface of the AlN polycrystalline substrate 31.

Thereafter, as shown in FIG. 3d, the nitride semiconductor crystals 34 were grown by LEO using dielectric patterns 33 having a stripe or lattice structure. This growth process may use conventional processes such as MOCVD, MBE, and the like. In the lateral epitaxial overgrowing process of this step, a lateral epitaxially overgrown-nitride layer 34 may be obtained in which nitride single crystals firstly grow on a region of the buffer layer 32 exposed between the dielectric patterns 33, a growth thickness thereof reaches the height of the dielectric patterns 33, lateral epitaxial overgrowth progresses over the dielectric patterns 33, and finally covers the dielectric patterns 33. Where the lateral epitaxially grown-nitride semiconductor layer 34 is a nitride single crystal containing Al such as AlGaN, it is difficult to grow high quality nitride crystals because Al has high reactivity with the dielectric patterns 33 such as $SiO_2$ or $Si_3N_4$ and adatoms have low surface mobility, thereby growing even on dielectric materials. Thus, in this case, it is preferable to form the lateral epitaxially overgrown-nitride semiconductor layer 34 while injecting Cl- or Br-based gas. As the Br- or Cl-based gas, it is preferable to use gas containing at least one selected from the group consisting of $Br_2$, $Cl_2$, $CBr_4$, $CCl_4$, HBr and HCl.

Then, as shown in FIG. 3e, a p-type nitride semiconductor layer 35, an active layer 36 and an n-type nitride semiconductor layer 37 were grown on the lateral epitaxially overgrown-nitride semiconductor layer 34. This growth process may be continuously carried out together with the lateral epitaxially overgrown-nitride semiconductor layer 34. For instance, the nitride semiconductor layers 35, 36 and 37 may be continuously grown in combination with the lateral epitaxially overgrown-nitride semiconductor layer 34 as described in FIG. 3d, under the condition in which they are placed in an MOCVD chamber. In this case, the lateral epitaxially overgrown-nitride semiconductor layer 34 described in FIG. 3d may be formed of an undoped region. Alternatively, it may be formed of a layer containing p-type impurities, as in the case of the p-type nitride semiconductor layer 35 and may be provided as a clad layer integrated with the p-type nitride semiconductor layer 35 on one side.

Finally, the n-type nitride semiconductor layer 37 and the active layer 36 were mesa etched to expose a portion thereof, a first electrode 39a was formed on a region of the exposed p-type nitride semiconductor layer 35, and then an n-type electrode 39b such as Ni/Au was formed on the upper surface of the n-type nitride semiconductor layer 37.

Alternatively, still another embodiment may be implemented by first forming a p-type nitride semiconductor layer on an AlN polycrystalline substrate, forming an active layer on the p-type nitride semiconductor layer, and then forming an n-type nitride semiconductor layer on the active layer.

As apparent from the above description, the present invention provides an inexpensive nitride semiconductor light-emitting device having superior characteristics, by forming a high quality nitride semiconductor layer on the substrate by LEO using an AlN polycrystalline or amorphous substrate having superior thermal conductivity and mechanical properties.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride semiconductor light-emitting device, comprising:
   a polycrystalline substrate made of AlN;
   a buffer layer formed on the AlN substrate;
   a plurality of dielectric patterns partially covering the buffer layer and having a stripe or lattice structure;
   a lateral epitaxially overgrown-nitride semiconductor layer which extends between the dielectric patterns and is in direct contact with both the buffer layer and the dielectric patterns;
   a first conductive nitride semiconductor layer on the nitride semiconductor layer;
   an active layer on the first conductive nitride semiconductor layer; and
   a second conductive nitride semiconductor layer formed on the active layer,
   wherein the AlN polycrystalline substrate has an upper surface having irregularities in a predetermined crystal face direction formed thereon, and
   wherein the substrate comprises a (GaIn)AlN substrate.

* * * * *